(12) United States Patent
Miura et al.

(10) Patent No.: US 9,288,913 B2
(45) Date of Patent: Mar. 15, 2016

(54) WIRING BOARD AND MANUFACTURING METHOD THEREOF

(71) Applicants: Hiroshi Miura, Miyagi (JP); Koei Suzuki, Kanagawa (JP); Atsushi Onodera, Kanagawa (JP); Takanori Tano, Chiba (JP)

(72) Inventors: Hiroshi Miura, Miyagi (JP); Koei Suzuki, Kanagawa (JP); Atsushi Onodera, Kanagawa (JP); Takanori Tano, Chiba (JP)

(73) Assignee: RICOH COMPANY, LTD., Tokyo (JP)

( * ) Notice: Subject to any disclaimer, the term of this patent is extended or adjusted under 35 U.S.C. 154(b) by 109 days.

(21) Appl. No.: 14/318,757

(22) Filed: Jun. 30, 2014

(65) Prior Publication Data
US 2015/0008019 A1   Jan. 8, 2015

(30) Foreign Application Priority Data

Jul. 2, 2013 (JP) ................................. 2013-139012
Oct. 4, 2013 (JP) ................................. 2013-208732

(51) Int. Cl.
H05K 1/03 (2006.01)
H05K 1/09 (2006.01)
H05K 1/00 (2006.01)
H05K 3/12 (2006.01)
H05K 3/00 (2006.01)

(52) U.S. Cl.
CPC ............ *H05K 3/1258* (2013.01); *H05K 3/1208* (2013.01); *H05K 1/0306* (2013.01); *H05K 1/097* (2013.01); *H05K 3/0026* (2013.01); *H05K 2201/0154* (2013.01); *H05K 2201/09827* (2013.01); *H05K 2203/108* (2013.01); *H05K 2203/1173* (2013.01)

(58) Field of Classification Search
CPC ..... H05K 1/0296; H05K 3/12; H05K 3/1258; H05K 2203/1173
USPC .................................. 174/255, 256, 257, 258
See application file for complete search history.

(56) References Cited

U.S. PATENT DOCUMENTS

| | | | |
|---|---|---|---|
| 5,043,784 | A | 8/1991 | Yamamoto et al. |
| 5,053,844 | A | 10/1991 | Murakami et al. |
| 5,060,041 | A | 10/1991 | Haga et al. |
| 5,108,843 | A | 4/1992 | Ohtaka et al. |
| 7,199,033 | B2 | 4/2007 | Hirai et al. |
| 7,485,576 | B2 | 2/2009 | Suh et al. |
| 7,612,455 | B2 | 11/2009 | Tano et al. |

(Continued)

FOREIGN PATENT DOCUMENTS

| | | |
|---|---|---|
| JP | 2005-310962 | 11/2005 |
| JP | 2006-163418 | 6/2006 |

(Continued)

OTHER PUBLICATIONS

U.S. Appl. No. 14/320,836, filed Jul. 1, 2014.

*Primary Examiner* — Sherman Ng
(74) *Attorney, Agent, or Firm* — IPUSA, PLLC

(57) ABSTRACT

A wiring board includes a variable wettability layer situated on a top surface of a support board and containing a material of which a critical surface tension changes by energy given thereto. A conductive layer is situated inside a concave portion formed in the variable wettability layer. The concave portion has opposite side walls formed in tapered surfaces inclining so that a distance between the side walls is reduced toward a bottom of the concave portion in a cross-sectional shape taken along a plane perpendicular to a conducting direction of the conductive layer. Upper edges of the side walls are formed in gently curved surfaces.

10 Claims, 13 Drawing Sheets

(56) References Cited

U.S. PATENT DOCUMENTS

| | | | |
|---|---|---|---|
| 2002/0126194 A1* | 9/2002 | Okabe | B41J 2/01 347/106 |
| 2004/0043334 A1* | 3/2004 | Kobayashi | G03F 7/0007 430/315 |
| 2005/0031973 A1* | 2/2005 | Kobayashi | G02B 5/201 430/7 |
| 2006/0087228 A1* | 4/2006 | Kobayashi | H01L 51/50 313/504 |
| 2010/0019235 A1* | 1/2010 | Iizumi | H01L 51/0013 257/40 |
| 2011/0226337 A1 | 9/2011 | Deguchi et al. | |
| 2012/0312583 A1 | 12/2012 | Suzuki et al. | |

FOREIGN PATENT DOCUMENTS

| | | |
|---|---|---|
| JP | 3788467 | 6/2006 |
| JP | 2009-105413 | 5/2009 |
| JP | 2013-016773 | 1/2013 |

\* cited by examiner

FIG.5

| EMBODIMENT | EMBODIMENT 1 | | | | EMBODIMENT 2 | EMBODIMENT 3 | | EMBODIMENT 4 |
|---|---|---|---|---|---|---|---|---|
| KIND OF CONCAVE PORTION | NARROW CONCAVE | ↑ | ↑ | WIDE CONCAVE | WIDE CONCAVE | NARROW CONCAVE | WIDE CONCAVE | NARROW CONCAVE |
| OSCILLATION FREQUENCY | 50kHz | 50kHz | 50kHz | 50kHz | 50kHz | 50kHz | 50kHz | 50kHz |
| LASER SCAN SPEED | 0.5m/sec | 0.5m/sec | 0.5m/sec | 0.5m/sec | 0.5m/sec | 0.5m/sec | 0.5m/sec | 0.5m/sec |
| LASER OUTPUT | 60mW | 60mW | 60mW | 60mW | 60mW | 40mW | 20mW | 40mW |
| NUMBER OF LASER SCANS | 1 TIME | 2 TIMES | 4 TIMES | 6 TIMES | 2 TIMES | 1 TIME | 6 TIMES | 1 TIME |
| AMOUNT OF SHIFT OF SCAN POSITION | — | 10 μm | 10 μm | 10 μm | 20 μm | — | 10 μm | 10 μm |
| WIDTH OF CONCAVE PORTION | 30 μm | 40 μm | 60 μm | 80 μm | 50 μm | 20 μm | 60 μm | 20 μm |

FIG.7
| CONDITION | OSCILLATION FREQUENCY (kHz) | 25 | 50 | 50 |
| --- | --- | --- | --- | --- |
| | SCAN SPEED (m/sec) | 1.7 | 1.7 | 0.5 |
| | PULSE WAVELENGTH (μm) | 68 | 34 | 10 |
| PROCESSED STATE | MICROSCOPE IMAGE PLAN VIEW OF EDGE OF CONCAVE PORTION | 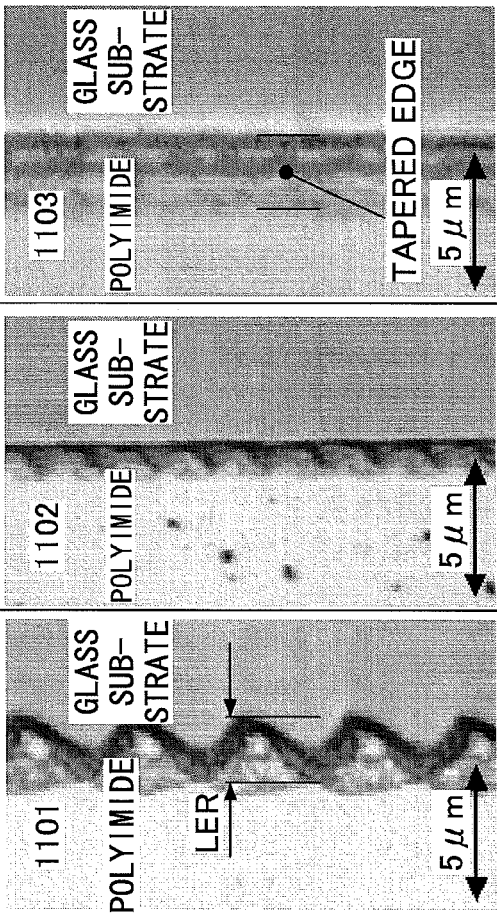 |  |  |
| | LER (μm) | 3.5 | 1.5 | 0 |

FIG.8

| | | | | | |
|---|---|---|---|---|---|
| PROCESS CONDITION | LASER OUTPUT (mW) | 60 | 60 | 60 | 60 |
| | NUMBER OF LASER SCANS | 1 | 2 | 4 | 6 |
| | AMOUNT OF SHIFT OF SCAN POSITION (μm) | – | 10 | 10 | 10 |
| PROCESSED STATE | MICROSCOPE IMAGE PLAN VIEW OF EDGE OF CONCAVE PORTION | 1201 POLYIMIDE / CONCAVE (EXPOSED GLASS) / TAPERED EDGE / CONCAVE WIDTH / 50 μm | 1202 / TAPERED EDGE / 50 μm | 1203 / TAPERED EDGE / 50 μm | 1204 / TAPERED EDGE / 50 μm |
| | CONCAVE WIDTH (μm) | 30 | 40 | 60 | 80 |
| | DEPTH (nm) | 570 | 570 | 570 | 570 |

FIG.12

| | | | |
|---|---|---|---|
| PROCESS CONDITION | LASER OUTPUT (mW) | 40 | 20 |
| | NUMBER OF LASER SCANS | 1 | 6 |
| | AMOUNT OF SHIFT OF SCAN POSITION (μm) | — | 10 |
| PROCESSED STATE | MICROSCOPE IMAGE PLAN VIEW OF EDGE OF CONCAVE PORTION | 1301 POLYIMIDE, CONCAVE, TAPERED EDGE (20 μm) | 1302 POLYIMIDE, CONCAVE (20 μm) |
| | CONCAVE WIDTH (μm) | 20 | 60 |
| | DEPTH (nm) | 500 | 150 |
| | GROOVE WIDTH × DEPTH (μm²) | 1 | 0.9 |

WIRING BOARD AND MANUFACTURING METHOD THEREOF

CROSS-REFERENCE TO RELATED APPLICATION

The present application is based upon and claims the benefit of priority of Japanese Patent Applications No. 2013-139012, filed on Jul. 2, 2013, and No. 2013-208732, filed on Oct. 4, 2013, the entire contents of which are incorporated herein by reference.

BACKGROUND OF THE INVENTION

1. Field of the Invention

The present invention relates to a wiring board and a manufacturing method of a wiring board.

2. Description of the Related Art

In recent years, a printed electronics technique is used to form a conductive layer on a top surface of a support member of a wiring board, which is generally used in semiconductor devices and electronic circuits. The printed electronics technique is to form a conductive layer pattern by printing a functional ink or paste, which is typically metal fine particles, directly on a base material. There are suggested wiring boards using various printing methods.

Japanese Laid-Open Patent Applications No. 2006-163418 and No. 2009-105413 disclose a wiring board having a conductive layer formed on a support member or the like so as to be capable of forming a thin-film transistor. A concave portion is formed on a support board by a laser abrasion method or etching method. The conductive layer is formed by applying a conductive material in the concave portion.

Japanese Laid-Open Patent Application No. 2013-016773 discloses a wiring board having a conductive layer formed in a concave portion on a top surface of a support member. The concave portion is formed in a variable wettability layer, of which a critical surface tension is changed by giving energy, on the top surface of the support member by using a layer abrasion method. The conductive layer is formed by applying conductive ink to the concave portion.

In order to form the conductive layer in the above-mentioned wiring board, the concave portion is first formed on the support board (including the variable wettability layer) by a laser abrasion method or etching method, and, then, a conductive material is applied to an interior of the concave portion. The shape of the concave portion varies in its size and width. However, as illustrated in a conceptual diagram of FIG. 1, the concave portion 90, in which the conductive layer 91 is formed, has a square-shape or trapezoid-shape having angled portions K.

Accordingly, electric field concentration tends to occur at the angled portions K, which may result in a decrease in a dielectric voltage between adjacent wirings. Additionally, when a lamination structure is formed, it may cause a decrease in an interlayer withstand voltage.

SUMMARY OF THE INVENTION

It is an object of the invention to provide a suitable shape of wirings in a wiring board.

In order to achieve the above-mentioned object, there is provided according to an aspect of the present invention a wiring board including: a support board; a variable wettability layer situated on a top surface of the support board and containing a material of which a critical surface tension changes by energy given thereto; and a conductive layer situated inside a concave portion formed in the variable wettability layer, wherein the concave portion has opposite side walls formed in tapered surfaces inclining so that a distance between the side walls is reduced toward a bottom of the concave portion in a cross-sectional shape taken along a plane perpendicular to a conducting direction of the conductive layer, and upper edges of the side walls are formed in gently curved surfaces.

There is provided according another aspect of the present invention a manufacturing method of a wiring board, including: forming a variable wettability layer on a support board, the variable wettability layer containing a material of which a critical surface tension changes by energy given thereto; forming a concave portion in the variable wettability layer by a laser abrasion method, the concave portion having opposite side walls formed in tapered surfaces inclining so that a distance between the side walls is reduced toward a bottom of the concave portion in a cross-sectional shape taken along a plane perpendicular to a conducting direction of the conductive layer, and upper edges of the side walls being formed in gently curved surfaces; and forming a conductive layer in said concave portion by applying conductive ink inside the concave portion.

It is to be understood that both the foregoing general description and the following detailed description are exemplary and explanatory and not restrictive of the invention.

BRIEF DESCRIPTION OF THE DRAWINGS

FIG. 5 illustrates processing conditions of concave portions;

FIG. 7 illustrates process states of an edge of a concave portion by microscope photographs;

FIG. 8 illustrates processed states of the concave portion by microscope photographs;

FIG. 12 illustrates processed states of concave portions by microscope photographs;

DETAILED DESCRIPTION OF THE PREFERRED EMBODIMENTS

A description will be given below, with reference to the drawings, of a wiring board according to an embodiment 1 of the present invention.

Figure 2A:
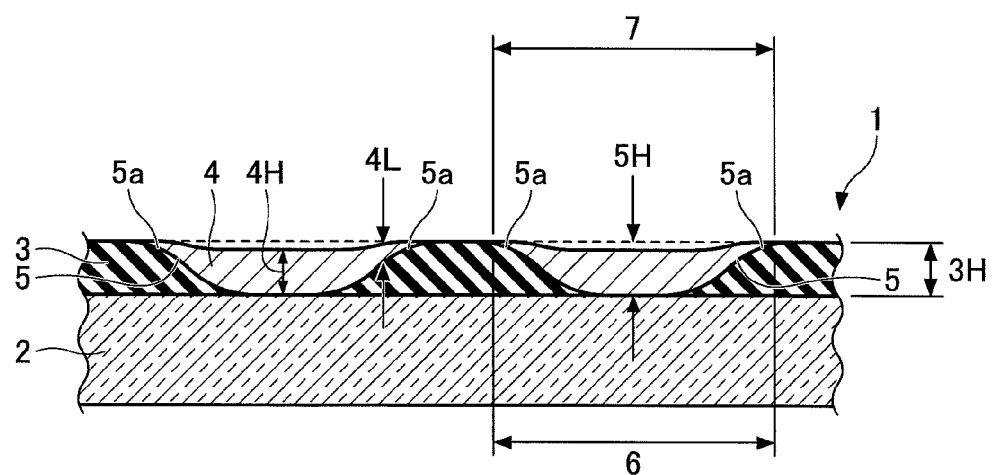
FIG. 2A is a cross-sectional view of a wiring board according an embodiment 1.
Figure 2B:
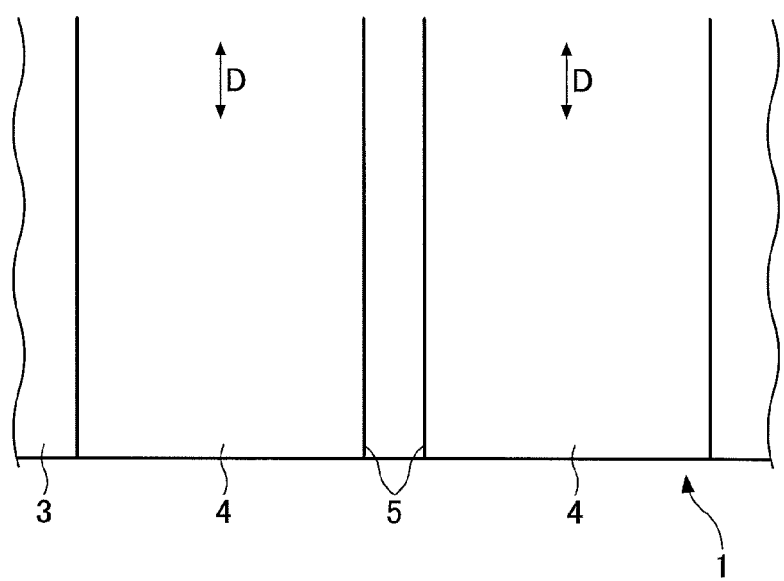
FIG. 2B is a plan view of the wiring board illustrated in FIG. 2A.

FIG. 2A is a cross-sectional view of a wiring board according to an embodiment 1 of the present invention. FIG. 2B is a plan view of the wiring board illustrated in FIG. 2A. FIG. 2A illustrates a cross-sectional view of the wiring board 1 taken along a plane perpendicular to a conducting direction (longitudinal direction) D of conductive layers 4 (refer to FIG. 2B)

The wiring board 1 according to the present embodiment includes a support board 2 and a variable wettability layer 3 formed on the top surface of the support board 2. The variable wettability layer 3 contains a material of which a critical surface tension is changed due to energy given thereto. Then, conductive layers 4 exhibiting conductivity are formed in the variable wettability layer 3. The conductive layers 4 are formed in the concave portions 5 formed in the variable wettability layer 3. The wiring board 1 has a structure in which the above-mentioned members 2, 3 and 4 are laminated as illustrated in FIG. 2A.

The support board 2 is, for example, a glass substrate or a film substrate. The film substrate includes a polyimide (PI) substrate, a polyether sulfone (PES) substrate, a polyethylene telephthalate (PET) substrate, a polycarbonate (PC) substrate, a polyethylene nafthalate (PEN) substrate, a polyether imide (PEI) substrate, a polyacrylate (PAR) substrate, etc.

The variable wettability layer 3 can be formed of a material of which a critical surface tension (may be referred to as surface free energy) is changed by giving an energy of light such as an ultraviolet beam. As a material of which a critical surface tension is changed, a material having a large change in a critical surface tension before and after giving energy is suitable. This is because a contrast of hydrophilic and liquid-repellency is high between a portion given energy and other portions. As a material of which a critical surface tension is changed, a polymer material is preferably used, and more preferably, a polymer material having a hydrophobic group in a side chain is used.

A hydrophobic group of a side chain is not limited to any special one, but is preferably a functional group of which a terminal group is —$CF_2CH_3$, —$CF_2CF_3$, —$CF(CF_3)_2$, —$CFH_2$, etc. Additionally, an alkyl group or fluoroalkyl group, an alkyl group or fluoroalkyl group having a multi-branched structure, and isotopes of the aforementioned are preferable. Those hydrophobic groups are preferably coupled with a main chain through a functional group represented by a structural formula containing C=O (carbonyl group), that is, —CO—, —COO—, —OCO—, —CONH—, —NHCOO—, —NHOCO—, and isotopes of the aforementioned, which are decomposed by giving energy. In this case, the side chain creates a hydrophilic group, such as a carboxyl group, a hydroxyl group, etc., by being reacted with a water component in the atmospheric air when a photosensitive group such as a functional group represented by a structural formula, —CO—, —COO—, —OCO—, —CONH—, —NHCOO— or —NHOCO, is disconnected due to irradiation of ultraviolet.

Accordingly, the surface is changed to hydrophilic (high surface energy). Especially, in a case of a side chain having a multibranched structure, the critical surface tension of the variable wettability layer can be changed greatly by giving less energy.

Additionally, the main chain of the aforementioned polymer material is not limited to special one, but it is preferable to use one which does not absorb ultraviolet or one which hardly absorbs ultraviolet. That is, it is preferable to use a structure in which a molecular structure of the main chain is not disconnected or hardly disconnected. This is because if the coupling of the main chain is cut off when giving energy by irradiation of ultraviolet, the control of the polymer itself is lowered such as a decrease in an insulation property, which causes a degradation in reliability.

Then, as a structure of the main chain satisfying the above-mentioned condition, there is, for example, a framework obtained by polymerizing polyimide, polyamideimide and (meth)acrylic acid. Considering insulation property, a structure containing polyimide in the main chain is particularly preferable. Because polyimide is generally a rigid structure and has a good filing ability, insulation property of a certain level can be maintained if energy is given by irradiation of ultraviolet and a molecular chain is disconnected. Accordingly, wiring having high reliability can be realized.

Additionally, if polyimide is used, because it has an absorption of about 2% but an insulation property is high and stable, a wettability control can be done while maintaining high insulation.

Here, as a polyimide, there are known a thermosetting polyimide, which is generated by a dehydrative condensation reaction by heating polyamic acid (polyamide acid), and a soluble polyimide which is soluble in a solvent, and either one is usable. The soluble polyimide can be made into a film by applying an application liquid, which is made by resolving polyimide into a solvent, and, thereafter, let the solvent evaporated at a low temperature of lower than 200° C.

On the other hand, the thermosetting polyimide must be set at a high temperature of higher than or equal to 200° C. because no reaction occurs unless it is heated at a level of generation of dehydrative condensation. Accordingly, a selection is made according to a heat-resistance of the substrate and various conditions.

Particularly, in a case of requiring a low-temperature process such as in a manufacturing process of a film substrate and causing surface energy to be changed by a small amount of irradiation of ultraviolet to improve productivity, a soluble polyimide such as disclosed in Japanese Patent Publication No. 5211729 is preferably used. This is a polyimide material having a main chain and a side chain containing a multi-branched structure, and a surface free energy thereof is changed by irradiation of ultraviolet.

The variable wettability layer 3 according to the present embodiment can be a single layer by mixing a plurality of materials including a material of which surface free energy is changed by irradiation of ultraviolet as mentioned above. Alternatively, the variable wettability layer 3 may be a single layer of only a material of which surface free energy is changed by irradiation of ultraviolet. Further, a material made by mixing a first material having an excellent electrical insulation and a second material having a greater rate of change of free surface energy by giving energy such as an ultraviolet beam than that of the first material. In this case, a structure in which a material distribution exists in a direction of thickness by using a difference in properties between both materials.

When the above-mentioned variable wettability layer 3 is formed, the concave portion 5 is changed into a high-surface-energy portion having a large critical surface tension and a portion other than the concave portion 5 of the variable wettability layer 3 is changed into a low-surface-energy portion having a small critical surface tension due to energy of light being given when forming the concave portion 5 in the variable wettability layer 3.

Accordingly, even in a case where conductive ink is applied outside the concave portion to form the conductive layer 4, the low-surface-energy portion hardly adheres and the conductive ink flows into the concave portion, which prevents generation of residual in the portion other than the concave portion 5. The thickness of the variable wettability layer 3 is not limited to a particular thickness, and a necessary thickness can be selected. This is because a necessary film thickness differs according to a depth of wiring (conductive layer) to be formed, a necessary insulation property, the form of the variable wettability layer 3, that is, for example, whether the variable wettability layer 3 is a single layer or a lamination.

A description is given below of the concave portion 5 formed in the variable wettability layer 3.

In the cross-sectional shape of the concave portion 5 in a plane perpendicular to an extending direction (longitudinal direction) of the conductive layer 4, opposite side walls of the concave portion 5 are tapered surfaces that incline downward so that a distance between the side walls is reduced toward a bottom of the concave portion 5. The upper edges 5a of the concave portion 5 are formed in gentle curves so that the top surface of the variable wettability layer 3 is connected to the side walls of the concave portion 5 without sharp corners.

Accordingly, the thickness of the conductive layer 4 formed in the concave portion 5 gradually decreases toward the upper edges 5a.

The depth and shape of the concave portion 5 are not limited to particular depths and shapes, and the thickness 3H of the variable wettability layer 3 may be equal to the depth 5H of the concave portion 5. Alternatively, although not illustrated in the figure, the depth 5H of the concave portion 5 may be smaller than the thickness 3H of the variable wettability layer 3.

A description will be given below of the conductive layer 4 formed in the concave portion 5.

The conductive layer 4 is a wiring layer formed by conductive ink applied inside the concave portion 5. The conductive ink is solidified by baking using an oven, a hot-plate or a light or irradiation of ultraviolet. The conductive ink is not limited to particular ink, and can be any ink, which exhibits conductivity after being solidified. The conductive ink can be, for example, a conductive material dissolved into a solvent, fine particles of a conductive material dispersed into a solvent, a precursor of a conductive material or the precursors dissolved into a solvent, a precursor of a conductive dispersed into a solvent, etc.

As a conductive material, there are, for example, silver (Ag), gold (Au), copper (Cu), platinum (Pt), palladium (Pd), tungsten (W), nickel (Ni), tantalum (Ta), bismuth (Bi), lead (Pb), indium (In), tin (Sn), zinc (Zn), titanium (Ti) or aluminum (Al), or an alloy of two or more metals selected from the aforementioned, or silver halide of those metals, copper oxide, etc. Additionally, a material obtained by a nanocarbon material, such as carbon nanotube, graphene, or the like, being dispersed into an organic solvent or water may be used. Further, there is used a solution of a conductive polymer, which is obtained by doping PSS (polystyrene sulfonic acid) into doped PANI (polyaniline) or PEDOT (polyethylene dioxythiophene). Particularly, silver, copper and carbon nanotube, which have a low-resistance, are preferable.

Because the conductive layer 4 is formed of conductive ink applied to inside the concave portion 5 and solidified, the shape of the conductive layer 4 is generally the same as the shape of the concave portion 5. Accordingly, the thickness 4L of the conductive layer 4 near the upper edges 5a of the concave portion 5 is smaller than the thickness 4H of the conductive layer 4 at the center of the concave portion 5. According to an amount of conductive ink applied in the concave portion 5, the thickness of the conductive layer 4 does not reach the depth 5H of the concave portion 5.

(Manufacturing Method of Wiring Board)

Figure 3A:
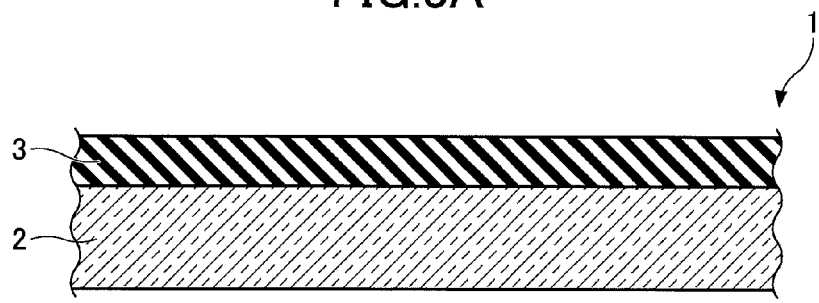
FIG. 3A illustrates a process of forming a variable wettability layer on a support board.
Figure 3B:
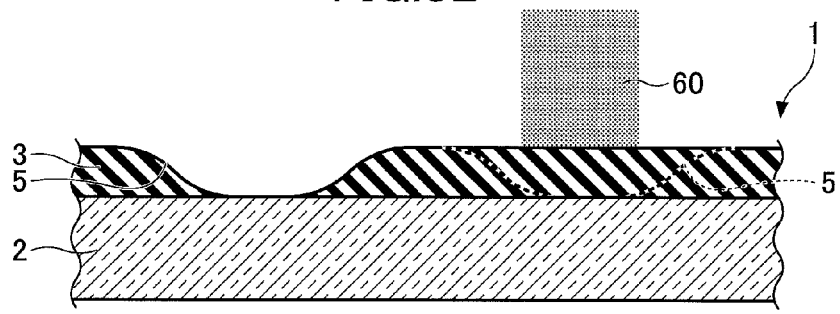
FIG. 3B illustrates a process of forming a concave portion on the variable wettability layer.
Figure 3C:
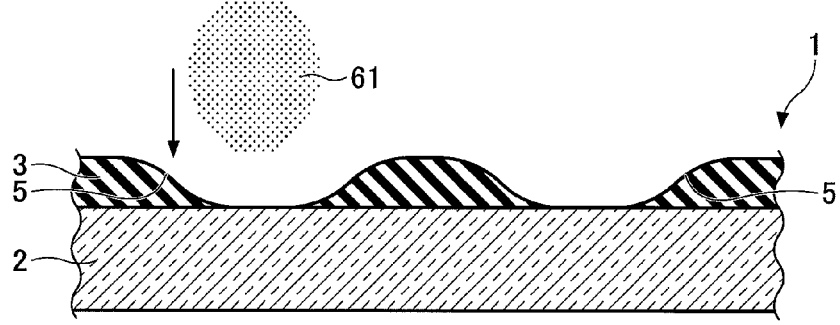
FIG. 3C illustrates a process of forming a conductive layer in the concave portion.
Figure 3D:
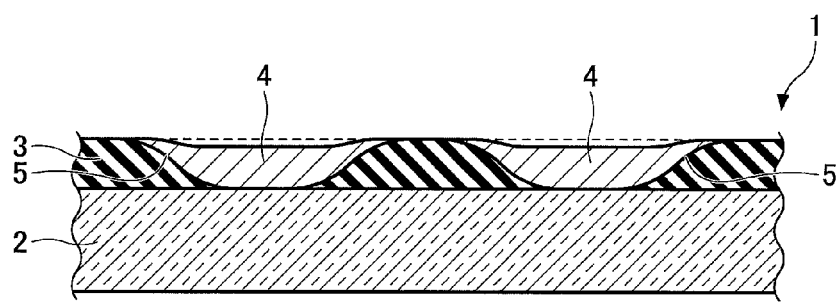
FIG. 3D illustrates a state after the conductive layers is formed.

A description is given below of a manufacturing method of the wiring board 1. FIGS. 3A through 3D illustrate the manufacturing method of the wiring board 1. FIG. 3A illustrates a process of forming the variable wettability layer 3 on the support board 2. FIG. 3B illustrates a process of forming the concave portion 5 on the variable wettability layer 3. FIG. 3C illustrates a process of forming the conductive layer 4 in the concave portion 5. FIG. 3D illustrates a state after the conductive layers 4 is formed. Illustrated in the figures and the support board 2, the variable wettability layer 3, the conductive layer 4, the concave portion 5 formed in the variable wettability layer 3, a laser beam 60, and conductive ink 61.

FIG. 3A illustrates a process of forming the variable wettability layer 3 on the support board 2. A method of forming the variable wettability layer 3 on the top surface of the support board 2 can be a spin coat method, a dip coat method, a screen printing method, an offset printing method, a flexographic printing method, a gravure printing method, a micro-contact method, an ink-jet method, a nozzle-printing method, an aerosol-jet method, etc.

Although not illustrated in the figures, an insulating layer may be provided on the top surface of the support board 2, and the variable wettability layer 3 may be provided on the insulating layer. The insulating layer can be formed by a spin coat method, a dip coat method, a screen printing method, an offset printing method, a flexographic printing method, a gravure printing method, a micro-contact method, an ink-jet method, a nozzle-printing method, an aerosol-jet method, etc.

FIG. 3B illustrates a process of forming the concave portion 5 on the variable wettability layer 3. The concave portion 5 is preferably formed on the variable wettability layer 3 by a laser abrasion method using a laser beam. According to the laser abrasion method, a surface of the concave portion 5 can be changed into a high-surface-energy area at the same time of forming the concave portion 5. Thus, not only an effect of a physical form of the concave portion 5 but also an effect of surface property modification can be obtained in the same process, which causes the conductive ink to be filled in the conductive portion 5 easily.

In the laser abrasion method, a gas laser or a solid-state laser can be used. An excimer laser may be preferably used as a gas laser. A YAG laser or YVO$_4$ laser is preferably used as a solid-state laser. A wavelength of the laser beam is preferably a wavelength of an ultraviolet light. If an excimer laser is used, a wavelength of 351 nm with XeF as a laser medium, a wavelength of 308 nm with XeCl as a laser medium, or a wavelength of 248 nm with KrF as a laser medium can be used. If a YAG laser or YVO$_4$ laser is used, a wavelength of 355 nm as a third higher harmonic wave or a wave length of 266 nm as a fourth higher harmonic wave can be used.

The suitable laser is selected according to an optical property of the variable wettability layer 3. That is, a laser having a wavelength shorter than a wavelength of a light absorption end in the light absorption spectrum of the variable wettability layer 3 is used. In a case where such a laser beam is irradiated onto the variable wettability layer 3, the variable wettability layer 3 absorbs the laser beam and the laser-absorbed portion of the variable wettability layer 3 is heated and sublimated, thereby forming the concave portion 5. The heat generation in the variable wettability layer 3 due to the irradiation of the laser beam spreads in a direction along the plane of the layer, and a portion of which temperature reaches higher than or equal to a predetermined temperature is sublimated and removed.

Accordingly, the concave portion 5 has a width larger than a diameter of the laser beam. In this condition, because the temperature becomes lower as a distance from an edge of the laser beam spot is increased outward, an amount of removal of the variable wettability layer 3 is reduced. Thus, an end portion (upper edge 5a) of the concave portion 5 outside the laser beam spot is formed in a gentle curve as illustrated in FIG. 2A and other similar figures (FIGS. 3B through 3D, 13 and 14).

Especially, as a method of forming the concave portion 5, a fine laser beam 60 necessary for forming the concave portion 5 is scanned on the variable wettability layer 3, or the variable wettability layer 3 as a work piece to be processed is moved. According to such a method of scanning the laser beam or moving the work piece, a manufacturing cost is reduced because no mask is needed, and, further, a complex pattern can be formed at a higher speed while suppressing an increase in a number of processing steps.

When forming the concave portion 5 on the variable wettability layer 3 by scanning the laser beam 60 as mentioned above, the laser beam 60 may be scanned using a galvanometer scanner.

If an area to form the concave portion 5 is larger than an area scanned by the laser beam by the galvanometer scanner, a "step and repeat" may be performed. That is, a part of the concave portion 5 is formed by irradiating the laser beam while the work piece is stationary, and, then, the work piece is moved to a next area and irradiating the laser beam while the work piece is stationary to form another part of the concave portion 5. By repeating the above-mentioned processes, the laser beam is irradiated onto a predetermined area to be processed, thereby forming the entire concave portion 5.

FIG. 3C illustrates a process of forming the conductive layer 4 in the concave portion 5 formed in the variable wettability layer 3. That is, conductive ink 61 is applied inside the concave portion 5 formed in the variable wettability layer 3, and the conductive ink 61 is solidified to form the conductive layer 4.

As a method of applying the conducting ink 61, a spin coat method, a dip coat method, a screen printing method, an offset printing method, a flexographic printing method, a gravure printing method, a micro-contact method, an ink-jet method, a nozzle-printing method, an aerosol-jet method, etc., may be used. Especially, the ink-jet method or the nozzle-printing method is preferable because application is performed with a viscosity and surface tension suitable for the conductive ink 61 flowing into the concave portion 5, which allows supplying a small droplet of conductive ink 61 to the concave portion 5. Additionally, either the ink-jet method or the nozzle-printing method provides a material-use-efficiency extremely higher than the spin coat method. Further, the above-mentioned two methods have an advantage that a large area can be processed because they are non-contact printing and do not use a mask (maskless).

FIG. 3D illustrates the conductive layer 4 formed by the conductive ink 61. The conductive ink 61 applied inside the concave portion 5 is solidified by baking using an oven or a hot plate or irradiation of a light such as an ultraviolet beam.

A further description will be given below of the wiring board 1 according to the embodiment 1.

Embodiment 1

The wiring board 1 according to the embodiment 1 is illustrated in FIGS. 2A and 2B.

FIG. 2A illustrates a cross-sectional shape perpendicular to a conducting direction D (refer to FIG. 2B) of the conductive layer 4 in the wiring board 1. FIG. 2B illustrates a plan view of the wiring board 1 illustrated in FIG. 2A.

The wiring board 1 includes the support board 2, the variable wettability layer 3 provided on the top surface of the support board 2, and the conductive layer 4 formed inside the concave portion 5 formed in the variable wettability layer 3. The variable wettability layer 3 contains a material of which a critical surface tension is changed by energy given thereto. The concave portion 5 and the conductive layer 4 are formed as wiring extending in a longitudinal direction D (conducting direction) of the wiring board 1. Although two wirings are illustrated in the figures, the number of wirings is not limited to two and a single wiring or a plurality of wirings may be formed.

The embodiment 1 has a feature in the cross-sectional shape of the concave portion 5. In the cross-sectional shape perpendicular to the conducting direction of the conductive layer 4, the opposite side walls of the concave portion 5 are formed as tapered surfaces, which are inclined inwardly (a direction toward the center) so that the lower portions of the side walls are closer to each other. The bottom of the concave portion 5 is formed in a curved shape.

Figure 1:
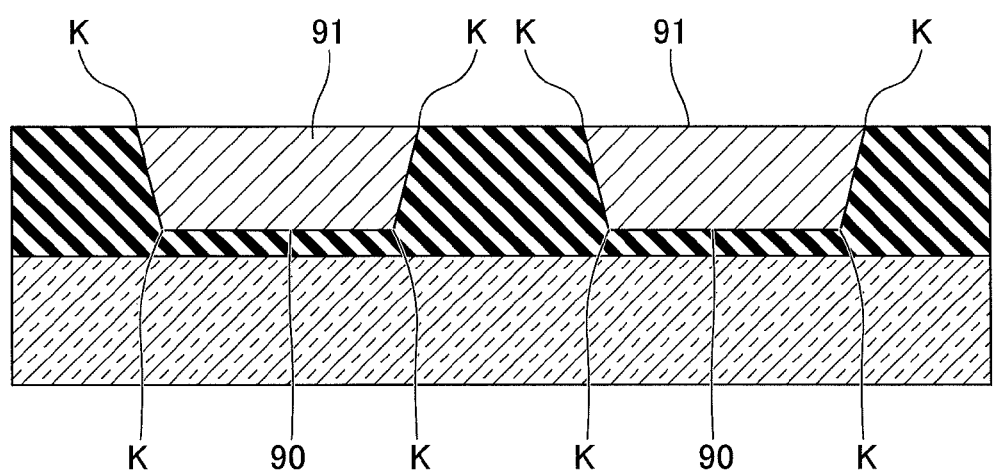
FIG. 1 is a conceptual diagram illustrating a concave portion to form a conductive layer.

Each of the upper edges (may be referred to as boundaries) 5a of the concave portion 5 is formed in a gently curved surface so that the side walls of the concave portion 5 are connected to the top surface of the variable wettability layer 3 without bent or angled portions (sharp corners). The taper angle of the upper edge 5a is about 20 degrees. According to the above-mentioned shape of the concave portion 5, the concave portion 5 does not have any angled portion (corner K) as compared to the conventional concave portion 90 illustrated in FIG. 1. Especially, the thickness of the conductive layer 4 is gradually reduced toward the upper edges 5a, and there is any angled portion (sharp corner), which surely prevents occurrence of an electric field concentration on the boundaries between the concave portion 5 and the variable wettability layer 3.

Accordingly, the center portion of the conductive layer 4 formed in the concave portion 5 has the largest thickness 4H, and a portion of the conductive layer 4 near the upper edge 5a has a smaller thickness 4L. The width 7 of the conductive layer 4 is equal to the width 6 of the concave portion 5.

The above-mentioned configuration of the conductive layer 4 and the concave portion 5 can effectively prevent occurrence of an electric field concentration at the boundaries between the upper edges 5a of the concave portion 5, in which the conductive layer 4 is formed, and the top surface of the variable wettability layer 3. Additionally, the above-mentioned configuration surely acquire a sufficient dielectric voltage withstand between adjacent conductive layers 4, and realizes the wiring board having a high accuracy.

Although the taper angle of the upper edge is set to about 20 degrees in the embodiment 1, the taper angle is not limited to 20 degrees and a taper angle ranging from about 10 degrees to 40 degrees may be set appropriately.

The variable wettability layer 3 can be formed by a polyimide NMP solution, which is a mixture of a soluble polyimide material containing a dendrimer at a side chain as a raw material and the polyimide CT4112 (trade name, manufactured by KYOCERA Chemical Corporation) having a higher insulation property than the soluble polyimide material and having no side chain.

The conductive layer 4 can be formed by electively applying the conductive ink 61, which is made of Ag particles of a diameter of about 30 nm dispersed into an aqueous medium, on the concave portion 5 and solidify the applied conductive layer 61. A method of forming the conductive layer 4 will be explained below.

Although the concave portion 5 illustrated in FIGS. 2A and 2B has the side walls tapered downward and inward so that the entire form of the concave portion 5 is an inverse conical shape, any form can be used if such a form can prevent occurrence of an electric concentration at the upper edges 5a (boundaries). For example, as an entire form of the concave portion 5, a gourd shape may also be used in which upper edges 5a of the side walls are formed in gently curved surfaces and portions of the side walls are wide.

(Manufacturing Method of Wiring Board According to Embodiment 1)

A description is given, with reference to FIGS. 3A through 3D, of a manufacturing method of the wiring board 1 according to the embodiment 1. Explanations already given above will be omitted to avoid duplicate explanations.

As illustrated in FIG. 3A, the variable wettability layer 3 is formed on a glass substrate (support board 2) which is cleaned by wet-cleaning.

As a material of the variable wettability layer 3, a polyimide NMP solution is used, which is a mixture of a soluble polyimide material A containing a dendrimer at a side chain as a raw material and the polyimide CT4112 (trade name, manufactured by KYOCERA Chemical Corporation) having a higher insulation property than the soluble polyimide material A and having no side chain.

The polyimide NMP solution is applied onto the glass substrate 2 by a spin coat method. Then, it is pre-baked at 100° C. in a nitrogen atmosphere in an oven. Thereafter, it is post-baked for one hour at 180° C. in a nitrogen atmosphere in the oven. The variable wettability layer 3 having a thickness of 570 nm is formed. At this time, the surface of the variable wettability layer 3 is at low surface energy due to the polyimide having a hydrophobic side chain.

Then, as illustrated in FIG. 3B, the concave portions 5 are formed in the variable wettability layer 3 by irradiating a laser beam 60 onto portions of the variable wettability layer 3, which portions correspond to the conductive layers 4 serving as wirings, electrodes or the like. The laser beam 60 is irradiated by a laser abrasion apparatus 700 illustrated in FIG. 4 according to CAD data. The surface of the concave portion 5 to which the laser beam is irradiated is changed to a high surface energy area. On the other hand, an area where the laser beam 60 is not irradiated is a low surface energy area due to the hydrophobic side chain of the polyimide.

Figure 4:
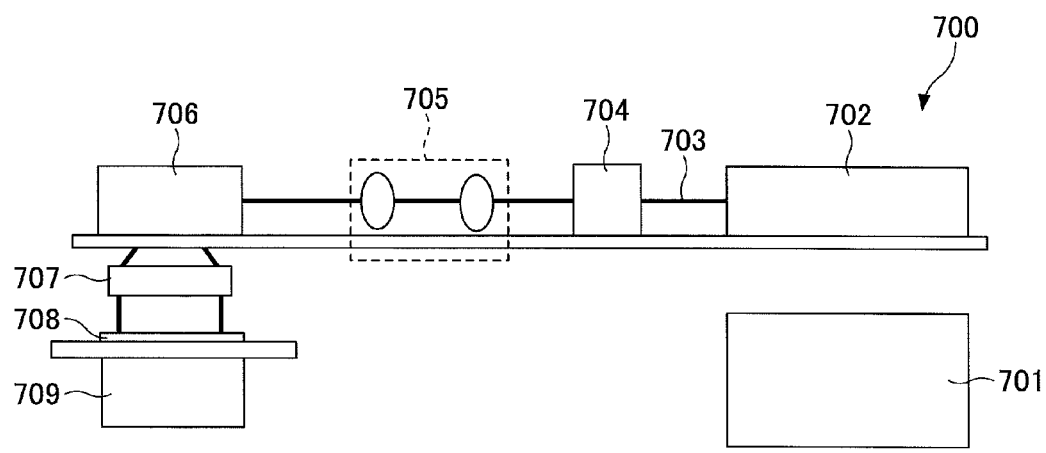
FIG. 4 is an outline view of a laser abrasion apparatus.

A description is given below, with reference to FIG. 4, of the laser abrasion apparatus 700. Illustrated in FIG. 4 are a controller 701, a laser head 702, a laser beam 703, a variable attenuator 704, a lens unit 705, a galvano-scanner 706, an fθ lens 707, a work piece 708, and a stage 709.

In the present embodiment, $YV_4$ laser was used as a laser. The laser head 702 includes Nd:$YVO_4$ laser crystal and non-linear optical crystal. The Nd:$YVO_4$ laser crystal is excited by a semiconductor laser, which is a laser diode excited $YVO_4$ laser, and a laser beam of a wavelength of 1064 nm is generated. The non-linear optical crystal is excited by the laser beam, and the laser beam 703 of a wavelength of 266 nm is generated. A laser power of the laser beam 703 is adjusted by the variable attenuator 704. The laser beam 703 is shaped into a predetermined beam diameter by the lens unit 705. The shaped laser beam is X-Y scanned by the galvano-scanner 706, and is changed into a parallel light by the fθ lens 707. The thus-generated laser beam is irradiated onto a surface of the work piece 708. The wavelength of the laser beam is 266 nm, and the laser beam diameter is 10 μm. The intensity distribution of the laser beam is a Gaussian distribution.

The work 708 is placed on the stage 709. The work 708 placed on the stage 709 can be moved by X-Y driving the stage 709. The stage 709 is equipped with an X-Y axis direct drive mechanism so that the work piece 708 can be moved and positioned.

The scanning range of the galvano-scanner 706 is 55 mm in X-direction and 55 mm in Y-direction. The laser beam is irradiated in the range of 55 mm square to form a concave portion at a predetermined position. The stage 709 can move the work 708 by X-Y driving the stage 709. If an area to be processed is larger than 55 mm square, a step and repeat operation is performed. That is, the laser beam is irradiated onto a 55 mm square area while the work piece 708 is at rest, and, then the work piece 708 is moved to a next position, and, thereafter, the laser beam is irradiated onto another 55 mm square area while the work piece 708 is at rest. By repeating the above-mentioned operations, the laser beam can be irradiated onto a predetermined area to be processed to form a concave portion of a predetermined size.

FIG. 5 illustrates processing conditions of the concave portions of the embodiments 1 through 4. The embodiments 2 through 4 will be explained later.

The processing condition of the concave portion 5 of the embodiment 1 is set as follows. The oscillation frequency of the laser beam is 50 kHz. The laser-scanning speed is 0.5 m/sec. The oscillation frequency and the laser-scanning speed are set according to the following results.

Figure 6:
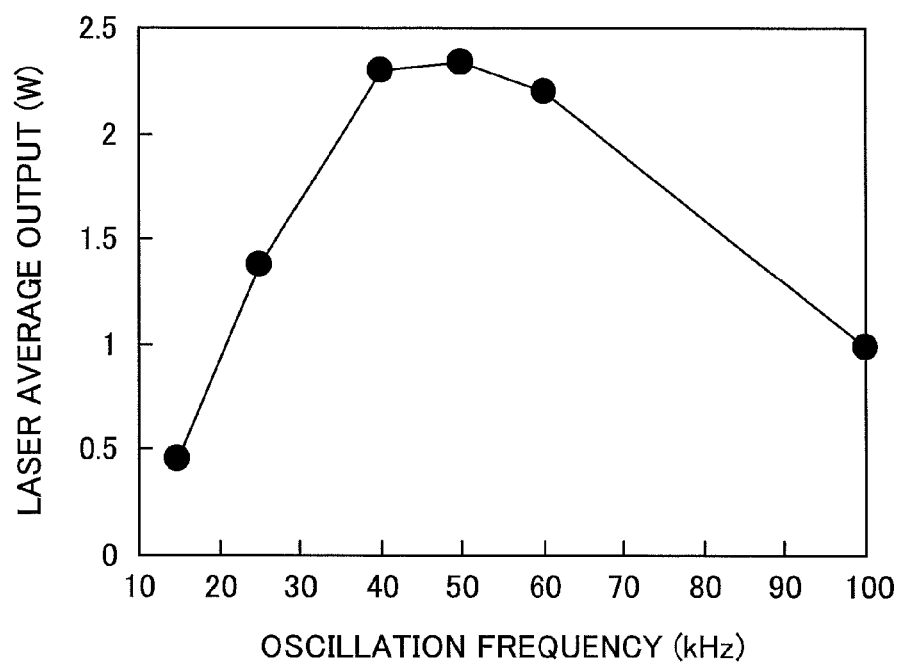
FIG. 6 is a graph indicating a laser output curve of the laser abrasion apparatus.

First, changes in a laser average output due to changes in the oscillation frequency, which is indicated in a graph of FIG. 6, is referred to in the setting of the oscillation frequency. The laser average output is changed according to the oscillation frequency, and the laser average output is maximal at the oscillation frequency of 50 kHz. Accordingly, the oscillation frequency in the embodiment 1 is set to 50 kHz at which a maximum power is obtained.

A description is given of setting of the laser-scanning speed. FIG. 7 illustrates process states of an edge of the concave portion by microscope photographs. Because the concave portion is formed by irradiating a pulse light, a line edge roughness (LER) becomes large according to a laser beam irradiating condition. The line edge roughness indicates a fluctuation generated in a boundary portion (edge of concave portion). The line edge roughness can be suppressed by controlling the laser beam irradiating condition. Specifically, the line edge roughness (LER) is suppressed by setting the laser scanning speed and the oscillation frequency so that a pulse interval (mm) of the laser is smaller than or equal to the laser beam diameter. The pulse interval is acquired by "laser scanning speed (mm/sec)÷oscillation frequency ((Hz) 1/sec)".

In the case of the embodiment 1, because the laser beam diameter is 10 μm and the oscillation frequency is 50 kHz, the laser scanning speed is set to less than or equal to 0.5 m/sec. The laser output is set to 60 mW. In FIG. 7, the photograph 1103 indicates a state of an edge of the concave portion processed in the condition where the oscillation frequency is 50 kHz and the laser scanning speed is 0.5 m/esc. In this condition, the pulse interval is 10 μm which was equal to the laser beam diameter. As illustrated in the photograph 1103 of FIG. 7, there is no line edge roughness (LER=0 μm) recognized in the edge of the concave portion. The edge is in a tapered shape. However, as illustrated in the photographs 1101 and 1102, when the oscillation frequency or the scanning speed is set so that the pulse interval is greater than the laser beam diameter, it is appreciated that a line edge roughness (LER) occurs in the edge of the concave portion.

FIG. 8 illustrates processed states of the concave portion by microscope photographs. The width of the concave portion is changed according to the processing condition. The photographs 1201 to 1204 of FIG. 8 illustrate four cases (concave portion of narrow width through concave portion of wide width) of the embodiment 1 illustrated in FIG. 5. The concave portions are processed by the condition where the oscillation frequency is 50 kHz and the laser scanning speed is 0.5 m/sec.

The concave portion can be formed in different shapes by linearly scanning a plurality of parallel laser beams. That is, when forming one concave portion 5, the width of the concave portion 5 can be changed by changing a number of scans of the laser beam. Here, the linearly scanning means scanning along a straight line or a curved line. The line indicates a position passing the center of the laser beam diameter. When forming the concave portion 5 by scanning a plurality of parallel laser beams, the intervals between the plurality of parallel lines are set to be less than or equal to the laser beam diameter.

Specifically, first, a first laser scanning process is performed to scan a laser beam along a predetermined scanning direction on the top surface of the variable wettability layer 3. Then, the scanning of the laser beam is repeated in a direction parallel to the scanning direction of the first laser scanning process at a position shifted from the scan start position of the immediately previous laser scanning by a distance less than or equal to the laser beam diameter. By the laser beam scanning being performed repeatedly, the concave portion 5 of a predetermined width is formed.

The scan start position of the repeated scanning process is sequentially shifted in a direction perpendicular to the first scanning direction. Because an amount of shift is less than or equal to the laser beam diameter, the width of the concave portion is changed in a state where no protrusion exists on the bottom surface of the concave portion as illustrated in FIGS. 2A and 2B.

In the present embodiment, the amount of shift of the second laser scan potion from the first laser scan position is 10 μm, which is equal to the laser beam diameter. However, the concave portion 5 having a different width may be formed by performing a laser beam scanning a plurality of times. If a width of the concave portion which can be formed by one time of the laser beam scanning is previously determined, the width of the concave portion can be set by the following relationship. That is, "width of concave portion=laser beam diameter X number of laser scanning+width of concave portion in a single laser scanning".

According to the above-mentioned laser scanning, opposite side walls of the concave portion 5 are formed in tapered surface in a cross-sectional shape perpendicular to the conducting direction of the conductive layer 4 so that a distance between the opposite side walls is continuously reduced downward (toward a bottom of the concave portion). The upper edges 5a of the side walls were formed in gently curved surfaces. Additionally, as illustrated in the photographs 1201 to 1204 of FIG. 8, it is recognized that the edges are tapered at any width of the concave portion.

Then, as illustrated in FIG. 3C, the conductive ink 61, which is made of Ag particles of a diameter of about 30 nm dispersed in an aqueous medium, is selectively applied onto the concave portion 5. Because an aqueous metal particle dispersed solution is used, the conductive ink 61 is spread over the concave portion 5, which is formed by a laser abrasion method, and a fine pattern is formed irrespective of the droplet size of ink-jet. Then, a pre-bake is performed at 100° C. in atmosphere in an oven, and, thereafter, a post-bake is performed for one hour at 180° C. in the oven. Thereby, as illustrated in FIG. 3D, Ag wirings (conductive layers 4) are formed in the concave portions 5.

Figure 9:
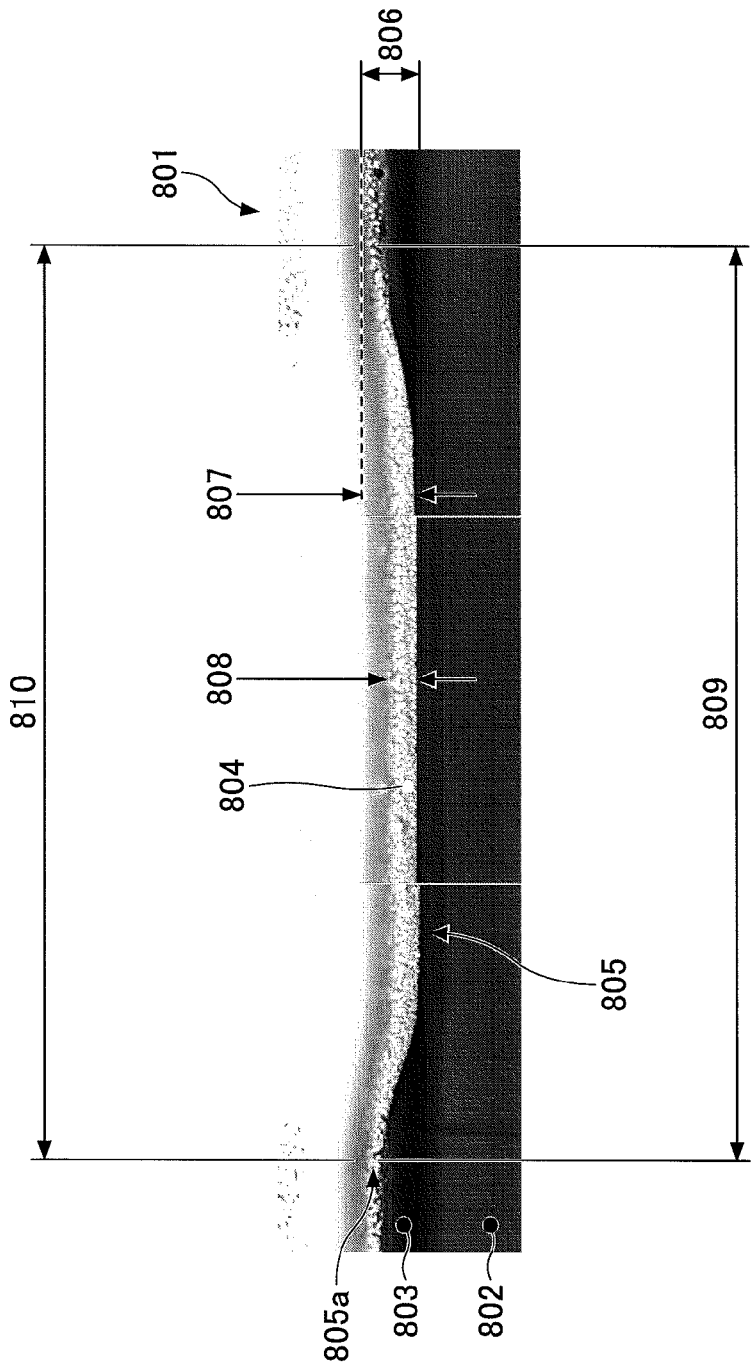
FIG. 9 illustrates a scanning electronic microscope (SEM) image of a cross-sectional view of a conductive layer in a wiring board.

FIG. 9 illustrates a scanning electronic microscope (SEM) image of a cross-sectional view of the conductive layer 4 (one line wiring) in a wiring board 801 manufactured by the above-mentioned manufacturing method.

Illustrated in FIG. 9 are a glass substrate 802, a polyimide layer serving as a variable wettability layer 803, an Ag wiring serving as a conductive layer 804, and a concave portion 805 formed in the polyimide layer. Side walls of the concave portion 805 are formed in tapered surfaces inclining downward so that a distance between the side walls is reduced toward a bottom of the concave portion 805. Because upper edges 805a are formed in gently curved surfaces, there is no angled portion. Accordingly, the conductive layer 804 in the concave portion 805 has a feature that the thickness is gradually reduced toward the upper edges 805a. The taper angle is about 20 degrees.

The thickness 806 of the polyimide layer serving as the variable wettability layer 803 is 570 nm. The depth 807 of the concave portion 805 is 570 μm, which is almost equal to the thickness 806 of the polyimide layer. The thickness 808 of the Ag wiring serving as the conductive layer 804 at the center of the concave portion is 260 nm. The thickness of the Ag wiring 804 near the edges of the concave portion is reduced toward the upper edges 805a. The width 809 of the concave portion 805 is 30 μm. The width 810 of the Ag wiring is also 30 μm.

According to the above-mentioned manufacturing method of the wiring board 1, the wiring board 1 can be manufactured by a simple and easy method without using photographic means. Additionally, when forming the conductive layer 4, the formation of the concave portion and the change of the surface of the concave portion 5 into a high surface energy area can be performed simultaneously by combining the variable wettability layer 3 and the laser abrasion method. Thus, the conductive layer 4 can be formed in a finer and accurate structure without a decrease in the insulate property by a less number of processes. Additionally, according to the above-mentioned abrasion method, the form of the concave portion 5 can be finely adjusted so that upper edges 5a are formed in the gently curved surfaces as mentioned above, which effectively suppresses occurrence of an electric field condensation. Further, the concave portion 5, which can give a sufficient dielectric strength voltage to the adjacent conductive layers 4, can be manufactured efficiently. Particularly, occurrence of LER is reliably suppressed by setting the laser scan speed and the oscillation frequency so that the pulse interval acquired by the relationship "pulse interval (mm)=laser scan speed (mm/sec)÷oscillation frequency ((Hz)1/sec)" is less than or equal to the laser beam diameter.

Embodiment 2

A description will now be given, with reference to FIG. 10, of a wiring board according to an embodiment 2.

Figure 10:
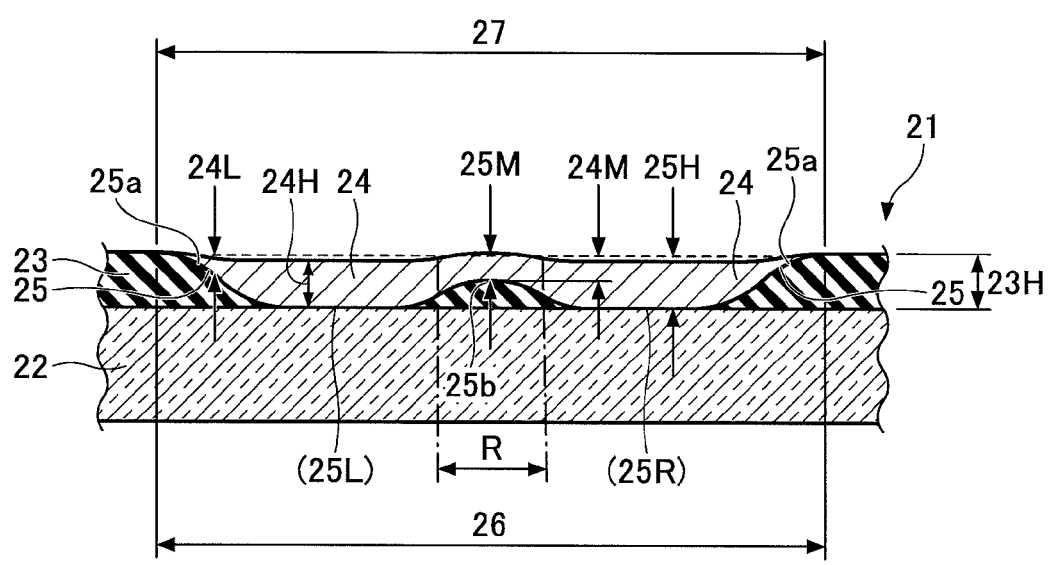
FIG. 10 illustrates a cross-sectional shape of a wiring board according to an embodiment 2.

FIG. 10 illustrates a cross-sectional shape of a wiring board 21 according to the embodiment 2. The cross-sectional shape illustrated in FIG. 10 is perpendicular to a conducting direction (refer to FIG. 2B) of a conductive layer 24a. The embodiment 2 is based on the same technical concept as the embodiment 1, and a description of the embodiment 2 is mainly focused on differences between the embodiment 2 and the embodiment 1.

Illustrated in FIG. 10 are a glass substrate 22 serving as a support board, a polyimide layer serving as a variable wettability layer 23, Ag wirings serving as conductive layers 24, and concave portions 25 formed in the polyimide layer. The polyimide layer serving as the variable wettability layer 23 is formed of the same material as the above-mentioned embodiment 1. The Ag wiring serving as the conductive layer 24 is also formed of the same material as the above-mentioned embodiment 1.

The concave portion 25 of the embodiment 2 has opposite side walls formed in tapered surfaces such that the width between the opposite side walls is gradually decreased downward (toward a bottom of the concave portion 25. The upper edges of the side walls are formed in gently curved surfaces so that the side walls are connected to the top surface of the variable wettability layer 23 without angled portions. The taper angle of the side walls is about 20 degrees. Accordingly, there is no angled portion unlike the conventional concave portion 90 illustrated in FIG. 1. That is, the thickness of the conductive layer 24 is gradually reduced toward the upper edges 5a, which is the same as the embodiment 1.

A protrusion 25b is formed on the bottom surface of the concave portion 25. The protrusion 25b is in a gently protruding shape having no angled portion. Only one protrusion 25b is illustrated in the figure, a plurality of protrusions 25b may be formed if necessary. That is, in the concave portion 25, the bottom is formed in a wave form. Thus, a portion 25M of which depth is smaller than other portions is formed by the protrusion 25b.

Accordingly, the thickness 24M of the conductive layer 24 at the depth 25M of the concave portion 25 is smaller than the thickness 24H of the conductive layer 24 at the depth 25H of the concave portion 25.

The thickness 24M of the conductive layer 24 is small at the center thereof, and the thickness 24L near the upper edges 25a is smaller.

The depth 25H at the deep portion of the concave portion 25 is 570 nm, which is almost equal to the thickness 24H of the conductive layer 24 (Ag wiring). The depth 25M at the shallow portion is about a half of the depth at the deep portion.

The thickness 24H of the conductive layer 24 (Ag wiring) is equal to or slightly smaller than the depth 25H of the concave portion 25. The thickness 24M of the conductive layer (Ag wiring) is almost equal to the depth 25M of the shallow portion of the concave portion 25. The width 26 of the concave portion 25 is 60 μm.

The thickness 24L of the conductive layer 24 near the upper edges 25a of the concave portion 25 is gradually reduced toward the upper edges 25a. The width 27 of the conductive layer 24 (Ag wiring) is 60 μm, which is equal to the width 26 of the concave portion 25.

As mentioned above, in the cross-sectional shape of the concave portion 25 perpendicular to the conducting direction, the opposite side walls are tapered surfaces, which continuously incline downward so that a distance between the side walls is reduced toward a bottom of the concave portion 25 in a cross-sectional shape taken along a plane perpendicular to a conducting direction of the conductive layer 24, and the bottom of the concave portion 25 is formed in a wave form due to the formation of the protrusion 25b. Accordingly, the contact area between the concave portion 25 and the conductive layer 24 formed in the concave portion 25 is large, which improves adhesiveness of the conductive layer 24. Additionally, the surface area of the conductive layer 24 is increased, which permits a structure advantageous to a device using a skin effect of a metal material such as an antenna.

(Manufacturing Method of Wiring Board According to Embodiment 2)

A description will be given of a manufacturing method of the wiring board 21 according to the embodiment 2. The manufacturing method of the wiring board 21 is similar to the manufacturing method of the wiring board 1 mentioned above. A description is given below of differences between the manufacturing method of the wiring board 21 and the manufacturing method of the wiring board 1.

In the manufacturing method of the wiring board 21, means for forming the concave portion 25 in the variable wettability layer 23 is different from the means for forming the concave portion 5 in the manufacturing method of the wiring board 1 (refer to FIG. 3B). However, the manufacturing method of the wiring board 21 also uses a laser abrasion method to form the concave portion 25.

FIG. 5 illustrates a processing condition of the concave portion according to the embodiment 2. The oscillation frequency, laser scan speed and laser output are the same as the embodiment 1. The difference between the embodiment 2 and embodiment 1 is in an amount of shift of the scan start position of the laser beam after the second time when forming the concave portion by scanning the laser beam a plurality of times. The amount of shift is set to 20 μm, which is larger than that of the embodiment 1.

In the embodiment 1, the amount of shift of the laser scan position is set to 10 μm, which is equal to the laser beam diameter in order to form the concave portion having no protrusion on the bottom surface. On the other hand, in the embodiment 2, the amount of shift of the laser scan position is set to a value (20 μm), which is larger than the laser beam diameter in order to form the concave portion 25 having the protrusion 25b on the bottom surface.

First, a polyimide layer, which is the variable wettability layer 23, is formed on the top surface of the support board 22 by the same manufacturing method as that described in the embodiment 1.

The concave portion 25 of the embodiment 2 is formed by linearly scanning a plurality of parallel laser beams (two times in the figure) as illustrated in FIG. 10. The scanning of the laser beams is performed so that an interval between the laser beams (two beams in the figure) exceeds the laser beam diameter. Linearly scanning refers to scanning a laser beam along a straight line or curved line, which line passes through the center of the laser beam.

Specifically, first, one concave portion 25L is formed on the top surface of the variable wettability layer 23 in the first laser beam scanning process. In the second laser beam scanning (corresponding to the repeated scanning process of the embodiment 1), the laser beam is scanned by shifting the laser beam position from the laser beam scanning position of the first time by 20 μm which exceeds the laser beam diameter. Here, exceeding the laser beam diameter means that a distance between the center line of the concave portion 25L and the center line of the concave portion 25R exceeds the laser beam diameter. Accordingly, the width of the concave portion 25 is large and the bottom surface of the concave portion 25 is in a wave form. The laser beam in the second laser beam scanning process is positioned to form the right concave portion 25R so that an overlap portion R is formed with the left concave portion 25L formed by the laser beam scanning in the first laser beam scanning process. According to the above-mentioned manufacturing method, the overlap portion R is formed in the center portion of the concave portion 25 as a protrusion 25b, which results in formation of the concave portion 25 having the protrusion 25b on the bottom surface thereof.

Thereafter, the conductive ink 61 is applied in the concave portion 25 and the applied conductive ink 61 is solidified to form the conductive layer 24 as is the same as the embodiment 1 (corresponding to FIGS. 3C and 3D).

According to the above-mentioned manufacturing method, the opposite side walls of concave portion 25 are formed as tapered surfaces, which continuously incline downward so that a distance between the side walls is reduced toward a bottom of the concave portion 25, without any angled portion. Additionally, the upper edges 25a can be formed in gently curved surfaces. That is, the thickness of the conductive layer 24 is gradually reduced toward the upper edges 25a.

Embodiment 3

A description will now be given, with reference to FIG. 11, of an embodiment 3 according to the present invention.

Figure 11:
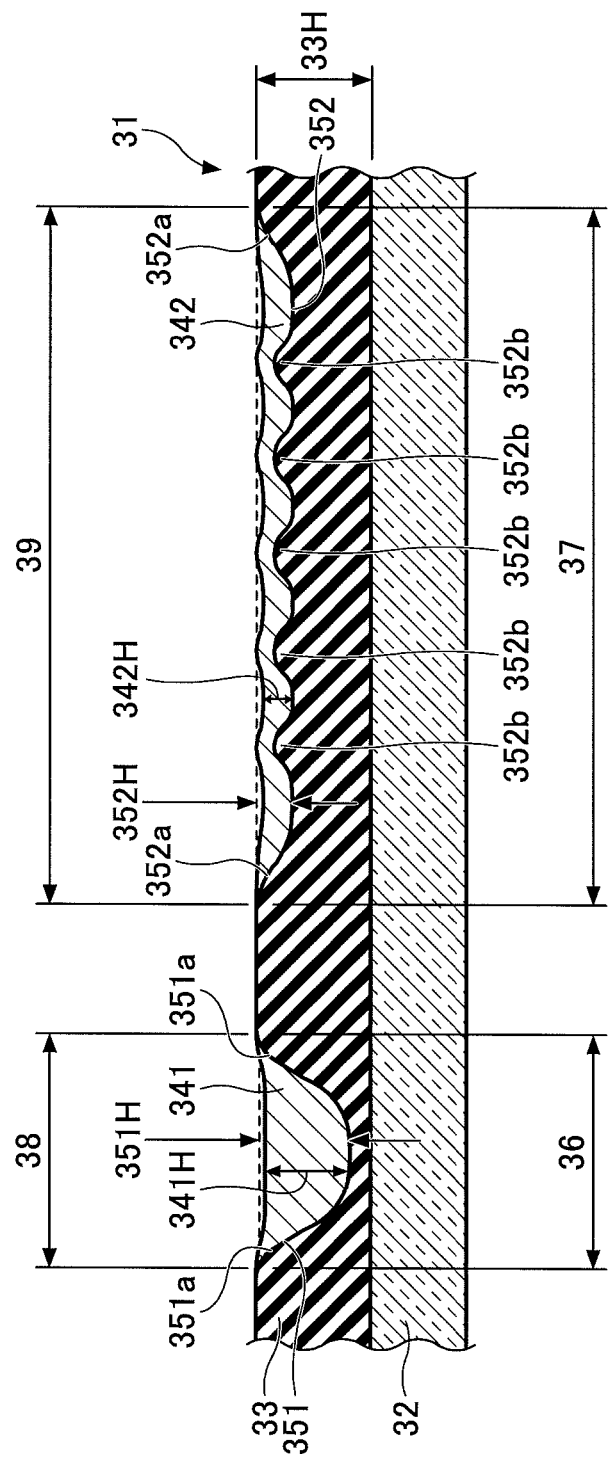
FIG. 11 illustrates a cross-sectional shape of a wiring board according to an embodiment 3.

FIG. 11 illustrates a cross-sectional shape of a wiring board 31. The cross-sectional view of FIG. 11 is perpendicular to the conducting directions (refer to FIG. 2B) of conductive layers 341 and 342. The embodiment 3 is based on the same technical concept as the embodiments 1 and 2. A description will be given of the differences between the embodiment 3 and the embodiments 1 and 2.

Illustrated in FIG. 11 are a glass substrate 32, a polyimide layer serving as a variable wettability layer 33, a narrow concave portion 351 formed in the polyimide layer, a conductive layer (Ag wiring) 341 in the narrow concave portion 351, a wide concave portion 352 formed in the polyimide layer, and a conductive layer (Ag wiring) 342 in the wide concave portion 352. The polyimide layer serving as the variable wettability layer 33 is formed by the same material as that explained in the embodiments 1 and 2. Also, the conductive layers 341 and 342 serving as Ag wirings are formed by the same material as that explained in the embodiment 1 and 2.

As illustrated in FIG. 11, in the embodiment 3, the two conductive layers, which are the conductive layers 341 and 342, are formed in the narrow concave portion 351 and the wide concave portion 352, respectively.

In the cross-sectional view of each of the concave portions 351 and 352 perpendicular to the conducting direction of each of the conductive layers 341 and 342, opposite side walls are formed in tapered surfaces, which continuously incline downward so that the width between the side walls is reduced toward a bottom of the concave portion 351 or 352. Additionally, the upper edges 351a and 352a are formed in gently curved surfaces. That is, similar to the embodiments 1 and 2, the thickness of the conductive layer 341 is gradually reduced toward the upper edges 351a and the thickness of the conductive layer 342 is gradually reduced toward the upper edges 352a.

In the cross-sectional shape of the concave portion 352, a plurality of protrusions 352b, each of which is a gently curved protrusion having no angled portion, are formed on the bottom surface of the concave portion 352. In the embodiment 3 illustrated in FIG. 11, six protrusions 352b are formed.

The concave portions 351 and 352 having different width are formed in the same plane of the variable wettability layer 33. There is a feature in the relationship between the concave portion 351 and the concave portion 352.

A description is given below of the relationship between the concave portion 351 and the concave portion 352.

Specifically, the concave portion having a width 36 and the concave portion having a width 37 are formed in shapes so that the cross-sectional area of the conductive layer 341 formed in the concave portion 351 is nearly equal to the cross-sectional area of the conductive layer 342 formed in the concave portion. Because the conductive layers 341 and 342 and the concave portions 351 and 352 are illustrated in cross-sectional shapes perpendicular to the conducting direction in FIG. 11, it is described that the cross-sectional areas of the conductive layers 341 and 342 are nearly equal to each other. However, because the concave portions 351 and 352 actually extend as illustrated in FIG. 2B, it is exactly explained that the volumes of the conductive layers 341 and 342 are nearly equal to each other.

Accordingly, the two conductive layers 341 and 342 have different thicknesses in the same layer (same plane) of the variable wettability layer 33. The thickness 342H of the conductive layer 342 having a large width is made smaller than the thickness 341H of the conductive layer 341 having a small width so as to make the cross-sectional areas of the conductive layers 341 and 342 close to each other. According to the above-mentioned configuration, non-continuity of resistances of the conductive layers 341 and 342 can be suppressed.

In the embodiment 3, the depth 351H of the narrow concave portion 351 is set to 500 nm, and the depth 352H of the wide concave portion 352 is set to 150 nm.

The thickness 341H of the conductive layer 341 (Ag wiring) in the concave portion 351 is equal to or slightly smaller than the depth 351H of the concave portion 351. The width 38 of the conductive layer 341 (Ag wiring) is 20 μm, which is equal to the width 36 of the concave portion. The thickness 342H of the conductive layer 342 (Ag wiring) in the concave portion 352 is also equal to or slightly smaller than the depth 352H of the concave portion 352. The width 37 of the concave portion 352 is 60 μm. The width 39 of the conductive layer 342 (Ag wiring) is 60 μm, which is equal to the width 37 of the concave portion 352.

Although two concave portions are provided in the embodiment 3 illustrated in FIG. 11, more than two concave portions having different widths may be provided. In such a case, the depth and shape of each concave portion are adjusted according to the width of each concave portion so that the cross-sectional areas (volumes) of the conductive layers are close to each other.

(Manufacturing Method of Wiring Board According to Example 3)

A description will now be given of a manufacturing method of the wiring board 31 according to the embodiment 3. The manufacturing method of the wiring board 31 is similar to the manufacturing method of the wiring boards of the embodiments 1 and 2. A description is given below of differences between the manufacturing method of the wiring board 31 of the embodiment 3 and the manufacturing method of the wiring boards of embodiments 1 and 2.

The difference is in the means to form two concave portions 351 and 352 having different widths in the variable wettability layer 33 (refer to FIG. 3B). However, the laser abrasion method is used in the manufacturing method of the wiring board 31 of the embodiment 3 as is the same as the manufacturing method of the wiring boards of the embodiments 1 and 2.

FIG. 5 illustrates a processing condition of the concave portion in the embodiment 3.

The oscillation frequency, laser scan speed, and an amount of shift of the scan position are the same as the embodiment 1. A difference between the embodiment 3 and the embodiment 1 is in the laser output. In a case of forming a wide concave portion, a laser output is set less than a laser output set in a case of forming a narrow concave portion. The depth of a concave portion is changed according to the laser output. The width of a concave portion is changed according to the number of laser beam scans similar to the embodiment 1. Accordingly, when forming a wide concave portion, the laser output is set lower and the number of laser beam scans is set larger than the case of forming a narrow concave portion. In the case of the embodiment 3, the narrow concave portion 341 is formed by setting the laser output to 40 mW and the number of laser beam scanning is one time, and the wide concave portion 352 is formed by setting the laser output to 20 mW and the number of laser beam scanning is six times.

According to the manufacturing method of the wiring board, first, a polyimide layer serving as the variable wettability layer 33 is formed on the top surface of the support board 32 by the same manufacturing method as the embodiment 1.

Then, the narrow concave portion 351 of the width 36 illustrated on the left side of FIG. 11 is formed by adjusting the laser output to 40 mW so that the narrow concave portion 351 is deeper than the wide concave portion 352 of the width 37 illustrated on the right side of FIG. 11. The wide and shallow concave portion 352 is formed by setting the laser output to 20 mW and, similar to the embodiment 2, slightly shifting the laser beam scan position after the second time from the laser beam scan of the first time. The amount of shift of the laser beam scan position is 10 μm, which is less than or equal to the laser beam diameter similar to the embodiment 1.

FIG. 12 illustrates processed states of the concave portions by microscope photographs.

In FIG. 12, the photographs 1301 (corresponding to the concave portion 351 of FIG. 11) and 1032 (corresponding to the concave portion 352 of FIG. 11) are images of the concave portions formed by a laser beam of which oscillation frequency is 50 kHz and a laser scan speed is 0.5 m/sec. The concave portion of the photograph 1301 is narrow and deep. The concave portion of the photograph 1302 is wide and shallow. The concave portions of the photographs 1301 and 1302 can be formed by changing a laser power and a number of times of laser beam scanning. The cross-sectional area of the concave portion is roughly estimated by a relationship "cross-sectional area=width X depth". The roughly estimated cross-sectional area of the narrow and deep concave portion of the photograph 1301 is 1 μm$^2$, and the roughly estimated cross-sectional area of the wide and shallow concave portion of the photograph 1302 is 0.9 μm$^2$. That is, the cross-sectional area of the narrow and deep concave portion of the photograph 1301 is close to the cross-sectional area of the wide and shallow concave portion of the photograph 1302. Additionally, as illustrated in the photograph 1301 of FIG. 12, edges of the concave portion are tapered.

Thereafter, similar to the embodiments 1 and 2, the conductive ink 61 is applied inside the concave portions 351 and 352, and the conductive ink 61 is solidified to form the conductive layers 341 and 342 (refer to FIGS. 3C and 3D).

Accordingly, if the cross-sectional areas of the concave portions 351 and 352, which are formed by the laser beam scanning, are close to each other, the cross-sectional areas (volumes) of the conductive layers 341 and 342 are also close to each other, thereby suppressing discontinuity of the resistances of the conductive layers 341 and 342.

According to the above-mentioned manufacturing method, the opposite side walls of the concave portion 351 can be tapered surfaces, which incline so that the distance between the side surfaces is continuously reduced downward (toward a bottom of the concave portion), without any angled portion. Additionally, the upper edges 351a can be formed in gently curved surfaces. Similarly, the opposite side walls of the concave portion 352 can be tapered surfaces, which incline so that the distance between the side surfaces is continuously reduced downward (toward a bottom of the concave portion), without any angled portion. Additionally, the upper edges 352a can be formed in gently curved surfaces.

Embodiment 4

A description will now be given, with reference to FIG. 13, of an embodiment 4 according to the present invention.

Figure 13:
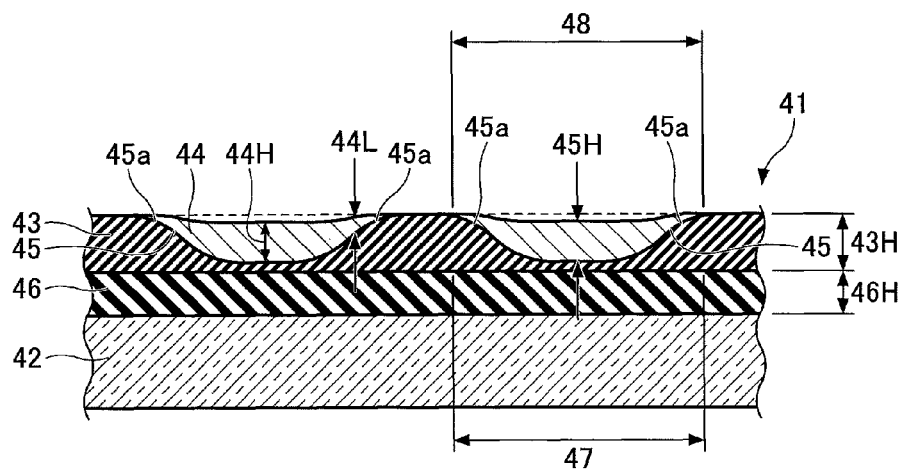
FIG. 13 illustrates a cross-sectional shape of a wiring board according to an embodiment 4.

FIG. 13 illustrates a cross-sectional shape of a wiring board 41. The cross-sectional view of FIG. 13 is taken along a plane perpendicular to a conducting direction (refer to FIG. 2B) of a conductive layer 44. The embodiment 4 is based on the same technical concept as the embodiments 1 to 3. A description is given of differences between the embodiment 4 and the embodiments 1 to 3.

The wiring board of the embodiment 4 has a lamination structure having a support board 42, an insulation layer 46 on the support board 42, and a variable wettability layer 43 on the insulation layer 46. A conductive layer 44 is formed in a concave portion 45 formed in the variable wettability layer 43.

The embodiment 4 has a feature in that the insulation layer 46 is provided between the support board 42 and the variable wettability layer 43. Accordingly, the functions can be separated into the variable wettability layer 43 and the insulation layer 43. Thus, a sufficient interlayer withstand voltage can be maintained to realize an accurate wiring board.

Similar to the above-mentioned embodiments 1 to 3, the support board 42 is a glass substrate, the variable wettability layer 43 is a polyimide layer, and the conductive layer 44 is Ag wiring.

The insulation layer 46 of the present embodiment is made of an insulating polyimide. The insulating polyimide differs from the polyimide of the variable wettability layer 43. That is, the insulating polyimide does not include a soluble polyimide material A having a side chain containing dendrimer, and, thereby, the insulating polyimide does not have a side chain. Thus, the insulating polyimide is discriminated from the polyimide of the variable wettability layer 43.

Specifically, the insulation layer 46 can be made of an organic material such as polyimide, polyamideimide, epoxy resin, silsesquioxane, polyvinyl phenol, polycarbonate, fluoride resin, polyparaxylene, polyvinyl butyral, etc. Here, polyvinyl phenol and polyvinyl alcohol may be cross-linked by a suitable cross-linking agent. As an inorganic material usable for the insulation layer 46, there are $TiO_2$, $SiO_2$, $Si_3N_4$, SiON, etc.

That is, any material, which can separate the support board 42 and the variable wettability layer 43, can be used to form the insulation layer 46.

The thickness 46H of the insulation layer 46 is preferably 500 nm. The thickness 43H of the variable wettability layer is preferably 570 nm. The depth 45H of the concave portion is preferably 500 nm, which is slightly smaller than the thickness 43H of the variable wettability layer 43.

The width 47 of the concave portion 45 is preferably 20 μm. The thickness 44H of the conductive layer 44 (Ag wiring) at the center of the concave portion 45 is equal to or slightly smaller than the depth 45H of the concave portion 45. The thickness 44L of the conductive layer 44 near the upper edges 45a of the concave portion 45 is gradually reduced toward the upper edges 45a. The width 48 of the conductive layer 44 is preferably 20 μm, which is equal to the width of the concave portion 45

(Manufacturing Method of Wiring Board According to Embodiment 4)

A description will now be given of a manufacturing method of the wiring board 41 according to the embodiment 4. It should be noted that the manufacturing method of the wiring board 41 is similar to the manufacturing method explained with reference to FIGS. 3A through 3D. A description is given below of a difference between the manufacturing method of the wiring board 41 and the manufacturing method of the wiring board 1 illustrated in FIGS. 3A through 3D.

The difference is in that a process of forming the insulation layer 46 on the top surface of the support board 42 is added before the process of forming the variable wettability layer 3 on the top surface of the support board 2 as illustrated in FIG. 3A.

First a polyimide solution PI213B (trade name, manufactured by Maruzen Petrochemical Co., Ltd.) is applied on the glass substrate (support board 42), which has been cleaned by wet-cleaning, and the polyimide solution 42 is prebaked at 100° C. in nitrogen atmosphere and baked at 180° C. to form the insulation layer 46.

Thereafter, the same process is performed with the manufacturing method illustrated in FIGS. 3A through 3D. That is, a polyimide layer, which is the variable wettability layer 43, is formed on the insulation layer 46 by the same material as that explained in the embodiment 1 and the same method as that explained in the embodiment 1. The concave portion 45 is also formed in the variable wettability layer 43 using the same method as that explained in the embodiment 1.

FIG. 5 illustrates a processing condition of the concave portion 45 according to the embodiment 4.

The oscillation frequency, laser scan speed and the amount of shift of scan position is the same as those of the embodiment 1. However, the laser output is different from that of the embodiment 1. The laser processing is performed by reducing the laser output to 40 mW in order to not give damages to the insulation layer 46 under the variable wettability layer 43 so that the polyimide forming the variable wettability layer 43 remains on the bottom surface of the concave portion 45.

Additionally, the conductive layer 44, which is Ag wiring formed in the concave portion 45, is also formed of the same material as the embodiment 1 by the same method as the embodiment 1.

According to the above-mentioned manufacturing method, the opposite side walls of the concave portion 45 can be tapered surfaces, which incline so that the distance between the side surfaces is continuously reduced downward (toward a bottom of the concave portion 45), without any angled portion. Additionally, the upper edges 45a can be formed in gently curved surfaces. The taper angle of the side walls is about 20 degreed.

Embodiment 5

A description will now be given, with reference to FIG. 14, of an embodiment 5 according to the present invention.

Figure 14:
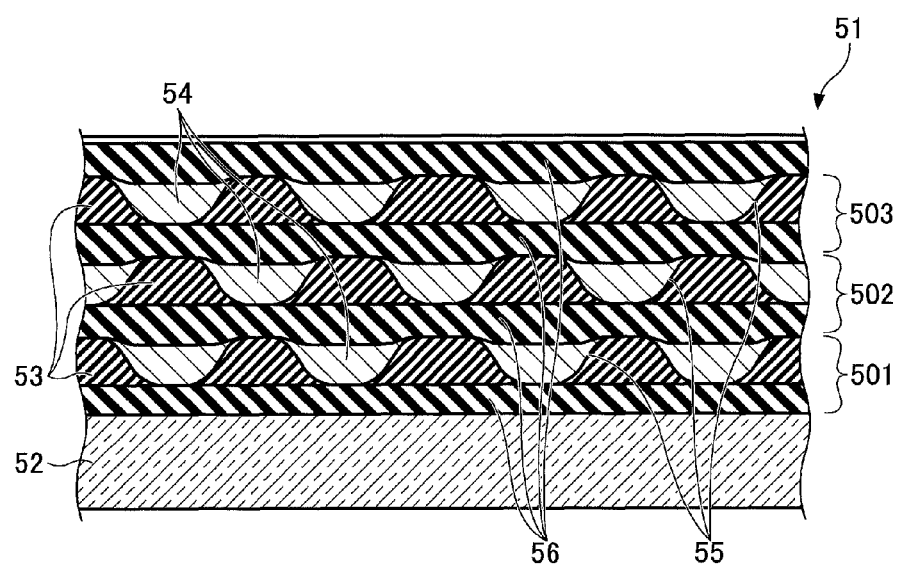
FIG. 14 illustrates a cross-sectional shape of a wiring board according to an embodiment 5.

FIG. 14 illustrates a cross-sectional shape of a wiring board 51. The cross-sectional view of FIG. 14 is taken along a plane perpendicular to a conducting direction (refer to FIG. 2B) of a conductive layer 54. The embodiment 5 is based on the same technical concept as the embodiment 1 or 4. A description is given of differences between the embodiment 4 and the embodiment 1 or 4.

In the basic structure of the wiring board 51, an insulating layer 56 is provided between the support board 52 and the variable wettability layer 53, which is the same as the embodiment 4.

Similar to each of the above-mentioned embodiments, the support board 52 is a glass substrate, the variable wettability layer 53 is made of polyimide, the conductive layer 54 is Ag wiring, and also the insulation layer 56 is made of polyimide different from the polyimide forming the variable wettability layer 53.

The difference is that the wiring board 51 has a lamination structure in which a plurality of lamination units 501 to 503 are stacked vertically on the support board 52. Each of the lamination units 501 to 503 includes the insulation layer 56 and the variable wettability layer 53 having conductive layers 54. The first lamination unit 501 is stacked on the support board 52, the second lamination unit 502 is stacked on the first lamination unit 501, and the third lamination unit 503 is stacked on the second lamination unit 502.

According to the above-mentioned lamination structure of the wiring board 51, a laminated wiring structure having less recess (stepwise concave) can be realized by interposing the insulation layer 46 between the variable wettability layers 53, which maintains a sufficient interlayer withstand voltage.

(Manufacturing method of Wiring Board According to Embodiment 5)

A description will be given of a manufacturing method of the wiring board 51 according to the embodiment 5. The basic manufacturing method is the same as the manufacturing method of the wiring board 1 as illustrated in FIGS. 3A through 3D.

In the manufacturing method of the wiring board 51, the manufacturing method of the embodiment 4 is repeated to stack the lamination units. A description of the first lamination unit 501 will be omitted.

After the first lamination unit 501 is formed on the support board 502 by the manufacturing method of the embodiment 4, a polyimide solution PI213B (trade name, manufactured by Maruzen Petrochemical Co., Ltd.) is applied onto the top surface of the variable wettability layer 53, which is the uppermost layer of the lamination unit 501 by a spin coat method. Then, the insulation layer 56 is formed by prebaking it at 100° C. in a nitrogen atmosphere and baking at 180° C.

Thereafter, the variable wettability layer 53 is formed on the top surface of the insulation layer 56 by using the same method as the embodiment 1. Then, the concave portions 55 and the conductive layers 54 serving as Ag wiring are formed by using the same method as the embodiment 1 to form the second lamination unit 502.

By repeating the above-mentioned manufacturing method of the second lamination unit 502, the third lamination unit 503 is formed. For or more lamination units may be formed by repeating the above-mentioned manufacturing method.

All examples and conditional language provided herein are intended for pedagogical purposes of aiding the reader in understanding the invention and the concepts contributed by the inventors to further the art, and are not to be construed as limitations to such specifically recited examples and conditions, nor does the organization of such examples in the specification relate to a showing of the superiority or inferiority of the invention. Although one or more embodiments and examples of the present invention have been described in detail, it should be understood that the various changes, substitutions, and alterations could be made hereto without departing from the spirit and scope of the invention.

What is claimed is:

1. A wiring board comprising:
a support board;
a variable wettability layer situated on a top surface of the support board and containing a material having a critical surface tension that changes by energy given thereto; and
a conductive layer situated inside a concave portion formed in the variable wettability layer,
wherein said concave portion has opposite side walls formed in tapered surfaces inclining so that a distance between said side walls is reduced toward a bottom of said concave portion in a cross-sectional shape taken along a plane perpendicular to a conducting direction of said conductive layer, and upper edges of said side walls are formed in smooth curved surfaces.

2. The wiring board as claimed in claim 1, wherein said concave portion has at least one protrusion on a bottom surface thereof in the cross-sectional shape.

3. The wiring board as claimed in claim 1, wherein a plurality of concave portions having different widths and different thicknesses are formed in said variable wettability layer such that the thicknesses increase as the widths decrease.

4. The wiring board as claimed in claim 1, wherein an insulation layer is interposed between said support board and said variable wettability layer.

5. The wiring board as claimed in claim 4, wherein said insulation layer and said variable wettability layer together form a lamination unit, and a plurality of the lamination units are stacked on said support board.

6. A manufacturing method of a wiring board, comprising:
forming a variable wettability layer on a support board, the variable wettability layer containing a material of which a critical surface tension changes by energy given thereto;
forming a concave portion in said variable wettability layer by a laser abrasion method, said concave portion having opposite side walls formed in tapered surfaces inclining so that a distance between said side walls is reduced toward a bottom of said concave portion in a cross-sectional shape taken along a plane perpendicular to a conducting direction of said conductive layer, and upper edges of said side walls being formed in gently curved surfaces; and
forming a conductive layer in said concave portion by applying conductive ink inside said concave portion.

7. The manufacturing method of a wiring board as claimed in claim 6, wherein the laser abrasion method uses a solid-state laser as a laser beam source and a galvano-scanner as a device to scan a laser beam, and wherein a laser scan speed and an oscillation frequency are set so that a pulse interval acquired by the laser scan speed divided by the oscillation frequency is smaller than or equal to a laser beam diameter.

8. The manufacturing method of a wiring board as claimed in claim 6, wherein said forming the concave portion includes scanning a plurality of parallel laser beams on said variable wettability layer, an interval between said parallel laser beams being set smaller than or equal to a laser beam diameter.

9. The manufacturing method as claimed in claim 6, wherein said forming the concave portion includes scanning a plurality of parallel laser beams on said variable wettability layer, an interval between said parallel laser beams being set larger than a laser beam diameter.

10. The manufacturing method as claimed in claim 6, wherein said forming a concave portion includes forming a plurality of concave portions having different widths and different thicknesses in said variable wettability layer such that the smaller the width, the larger the thickness.

* * * * *